United States Patent
Nagashima et al.

(10) Patent No.: US 8,085,585 B2
(45) Date of Patent: Dec. 27, 2011

(54) SEMICONDUCTOR MEMORY DEVICE

(75) Inventors: Hiroyuki Nagashima, Yokohama (JP); Hirofumi Inoue, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/158,098

(22) Filed: Jun. 10, 2011

(65) Prior Publication Data

US 2011/0241225 A1 Oct. 6, 2011

Related U.S. Application Data

(63) Continuation of application No. 12/325,040, filed on Nov. 28, 2008, now Pat. No. 8,027,188.

(30) Foreign Application Priority Data

Nov. 28, 2007 (JP) ................................. 2007-307587

(51) Int. Cl.
*G11C 11/00* (2006.01)
(52) U.S. Cl. ........................................ 365/163; 365/113
(58) Field of Classification Search .................. 365/163, 365/148, 113
See application file for complete search history.

(56) References Cited

U.S. PATENT DOCUMENTS

| | | | |
|---|---|---|---|
| 2004/0042313 A1* | 3/2004 | Fricke et al. | 365/222 |
| 2008/0002455 A1* | 1/2008 | Toda et al. | 365/148 |
| 2008/0002456 A1* | 1/2008 | Toda et al. | 365/148 |
| 2008/0002457 A1* | 1/2008 | Toda et al. | 365/148 |
| 2008/0258129 A1* | 10/2008 | Toda | 257/5 |

FOREIGN PATENT DOCUMENTS

| | | |
|---|---|---|
| JP | 2001-168294 | 6/2001 |
| JP | 2006-279042 | 10/2006 |
| JP | 2006-294179 | 10/2006 |

* cited by examiner

*Primary Examiner* — Jason Lappas
(74) *Attorney, Agent, or Firm* — Oblon, Spivak, McClelland, Maier & Neustadt, L.L.P.

(57) ABSTRACT

A semiconductor memory device includes a memory block having a three-dimensional memory cell array structure in which memory cell arrays are stacked, the memory cell array including: a plurality of first interconnections which are parallel to one another; a plurality of second interconnections which are formed so as to intersect with the plurality of first interconnections, the second interconnections being parallel to one another; and a memory cell which is disposed in each intersection portion of the first interconnection and the second interconnection, one end of the memory cell being connected to the first interconnection, the other end of the memory cell being connected to the second interconnection. The first interconnection disposed between the adjacent memory cell arrays is shared by memory cells above and below the first interconnection, and the vertically-overlapping first interconnections are connected to each other.

12 Claims, 16 Drawing Sheets

FIG. 7
(a) SCHOTTKY STRUCTURE
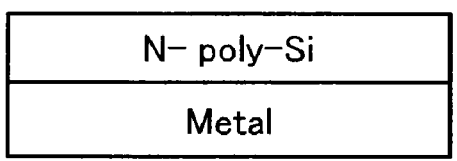
(d) MIM STRUCTURE
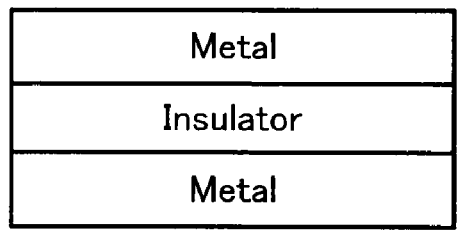
(b) PN STRUCTURE
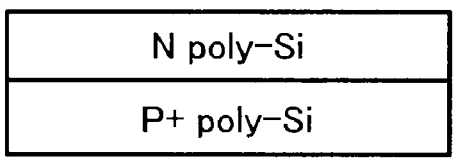
(e) SIS STRUCTURE
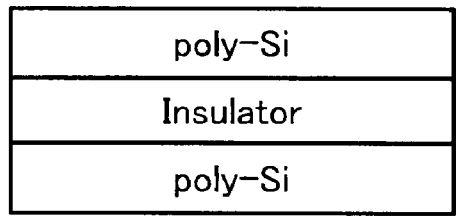
(c) PIN STRUCTURE
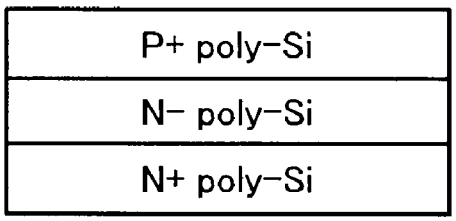

WL/BL WAVEFORM

SEMICONDUCTOR MEMORY DEVICE

CROSS REFERENCE TO RELATED APPLICATIONS

This application is a continuation of U.S. application Ser. No. 12/325,040 filed on Nov. 28, 2008, and is based on and claims the benefit of priority from prior Japanese Patent Application No. 2007-307587, filed on Nov. 28, 2007, the entire contents of each of which are incorporated herein by reference.

BACKGROUND OF THE INVENTION

1. Field of the Invention

The present invention relates to a semiconductor memory device, and particularly to a structure of a three-dimensional memory block having a stacked structure.

2. Description of the Related Art

With higher integration and finer design of a semiconductor integrated circuit, it is necessary to form an element in a smaller area in higher density. Particularly, in a semiconductor memory, one of important problems is to form an element in a smaller area in higher density to produce a memory at low cost per bit unit price.

However, conventionally in a multi-layer NAND flash memory which is one of the lowest-cost memories, further cost reduction becomes difficult due to difficulty in processing and a limit of a field effect transistor with reduction of a production rule.

On the other hand, a memory having a structure in which memory cells with no field effect transistor are three-dimensionally arrayed has been proposed as a memory in which memory elements are arrayed in higher density (for example, Japanese Patent Application Laid-Open No. 2003-78114). In some of memory cells used in the memory as disclosed in Japanese patent Publication Laid-Open No. 2003-78114, a memory element such as a phase change memory, a resistance change memory, and a conductance-bridge memory are used with a diode or a non-ohmic element which can bi-directionally restrict a current.

However, in the three-dimensional type memory, a structure of a peripheral circuit becomes complicated, and the chip-size reduction is hardly achieved in the peripheral circuit.

SUMMARY OF THE INVENTION

According to one aspect of the invention, a semiconductor memory device includes a memory block having a three-dimensional memory cell array structure in which memory cell arrays are stacked, the memory cell array including: a plurality of first interconnections which are parallel to one another; a plurality of second interconnections which are formed so as to intersect with the plurality of first interconnections, the second interconnections being parallel to one another; and a memory cell which is disposed in each intersection portion of the first interconnection and the second interconnection, one end of the memory cell being connected to the first interconnection, the other end of the memory cell being connected to the second interconnection, wherein the first interconnection disposed between the adjacent memory cell arrays is shared by memory cells above and below the first interconnection, and the vertically-overlapping first interconnections are connected to each other.

According to another aspect of the invention, a semiconductor memory device includes a memory block having a three-dimensional memory cell array structure in which memory cell arrays are stacked, the memory cell array including: a plurality of first interconnections which are parallel to one another; a plurality of second interconnections which are formed so as to intersect with the plurality of first interconnections, the second interconnections being parallel to one another; and a memory cell which is disposed in each intersection portion of the first interconnection and the second interconnection, one end of the memory cell being connected to the first interconnection, the other end of the memory cell being connected to the second interconnection, wherein the first interconnection disposed between the memory cell arrays which are adjacent to the first interconnection in a stacking direction is shared by memory cells above and below the first interconnection, and the vertically-overlapping first interconnections are connected to each other by commonly connecting all first ends of the plurality of first interconnections which are adjacent in the stacking direction.

According to still another aspect of the invention, a semiconductor memory device includes a memory block having a three-dimensional memory cell array structure in which memory cell arrays are stacked, the memory cell array including: a plurality of first interconnections which are parallel to one another; a plurality of second interconnections which are formed so as to intersect with the plurality of first interconnections, the second interconnections being parallel to one another; and a memory cell which is disposed in each intersection portion of the first interconnection and the second interconnection, one end of the memory cell being connected to the first interconnection, the other end of the memory cell being connected to the second interconnection, wherein the first interconnection disposed between the memory cell arrays which are adjacent to the first interconnection in a stacking direction is shared by memory cells above and below the first interconnection, and the vertically-overlapping first interconnections are connected to each other by commonly connecting all first ends and second ends of the plurality of first interconnections which are adjacent in the stacking direction.

BRIEF DESCRIPTION OF THE DRAWINGS

FIG. 7 is a sectional view schematically showing an example of a non-ohmic element in the same embodiment;

DETAILED DESCRIPTION OF THE EMBODIMENTS

A semiconductor memory device according to an embodiment of the invention will be described below with reference to the drawings.

Entire Configuration

Figure 1:
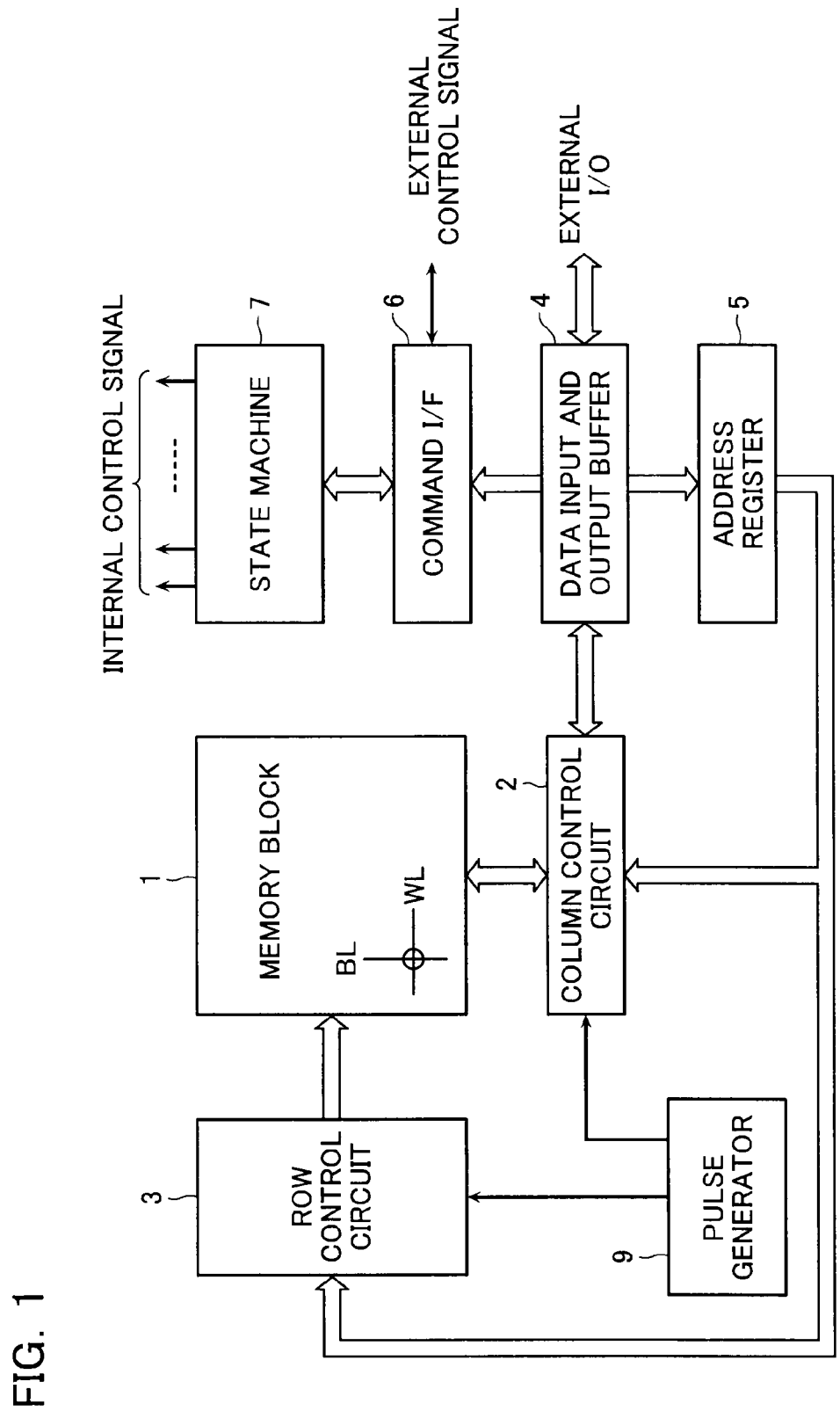
FIG. 1 is a block diagram showing a nonvolatile memory according to an embodiment of the present invention.

FIG. 1 is a block diagram showing a nonvolatile memory according to an embodiment of the invention.

The nonvolatile memory includes a memory block 1 in which memory cell arrays are stacked. In the memory cell array, memory cells in which later-mentioned resistance-change type elements are used are arrayed in a matrix shape. A column control circuit 2 is provided adjacent to the memory block 1 in a direction of a bit line BL. The column control circuit 2 controls the bit line BL of the memory block 1 to erase data of the memory cell, to write data in the memory cell, and to read data from the memory cell. A row control circuit 3 is provided adjacent to the memory block 1 in a direction of a word line WL. The row control circuit 3 selects the word line WL of the memory block 1 to apply a voltage necessary to erase data of the memory cell, to write data in the memory cell, and to read data from the memory cell.

A data input and output buffer 4 is connected to an external host (not shown) through an I/O line to receive write data, to receive an erase command, to supply read data, and to receive address data and command data. The data input and output buffer 4 sends the received write data to the column control circuit 2, and receives the data read from the column control circuit 2 and supplies the data to the outside. The address supplied from the outside to the data input and output buffer 4 is sent to the column control circuit 2 and the row control circuit 3 through an address register 5. The command supplied from the host to the data input and output buffer 4 is sent to a command interface 6. The command interface 6 receives an external control signal from the host to determine whether the data fed into the data input and output buffer 4 is the write data, the command, or the address. When the data is the command, the command interface 6 receives the command, and transfers the command in the form of a command signal to a state machine 7. The state machine 7 manages the whole of the nonvolatile memory. The state machine 7 accepts the command from the host to manage the data read, the data write, the data erase, and the data input and output.

The state machine 7 supplies a control signal to a pulse generator 9. In response to the control signal, the pulse generator 9 supplies a certain voltage and a write pulse at certain timing. The pulse generated by and supplied from the pulse generator 9 is transferred to any interconnection which is selected by the column control circuit 2 and the row control circuit 3.

Memory Cell Array and Peripheral Circuit Thereof

Figure 2:
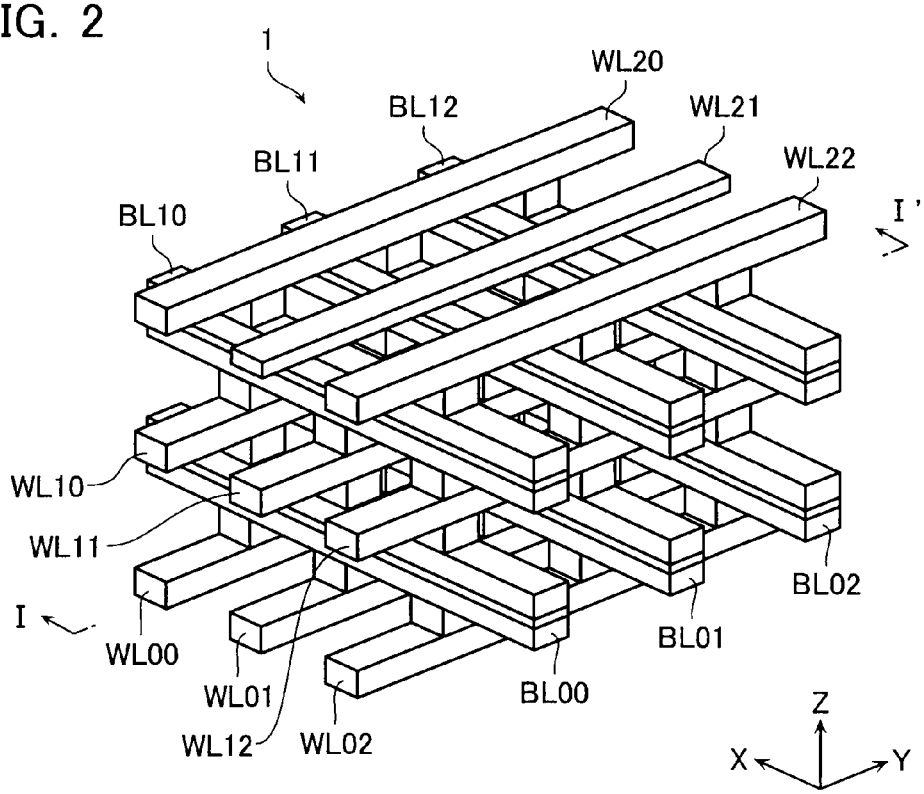
FIG. 2 is a perspective view partially showing a memory block of the embodiment.
Figure 3:
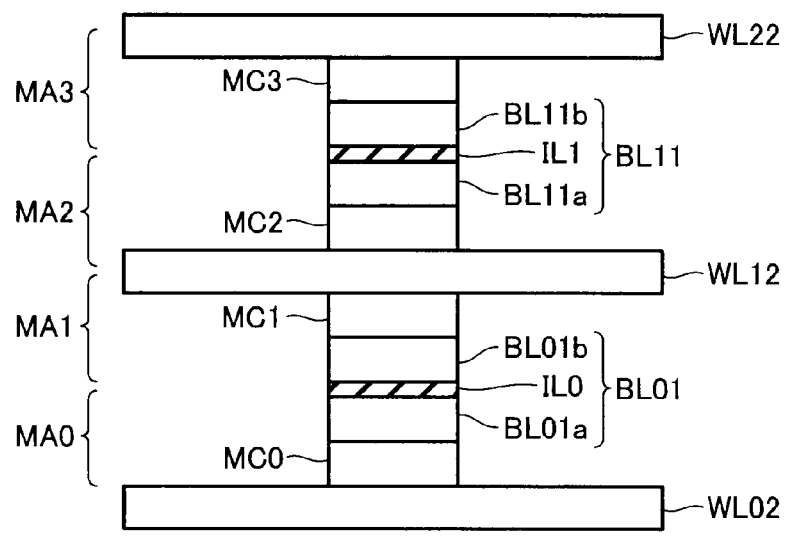
FIG. 3 is a sectional view showing memory cell taken on I-I' line and seen from the direction of the arrow in FIG. 2.

FIG. 2 is a perspective view partially showing the memory block 1, and FIG. 3 is a sectional view showing memory cell in a longitudinal direction taken on I-I' line and seen from the direction of the arrow in FIG. 2.

The word lines WL as the plural first interconnections are provided in parallel, and the bit lines BL as the plural second interconnections are provided in parallel while intersecting with the word lines WL. A memory cell MC is disposed in each intersection portion so as to be sandwiched between the interconnections.

Although FIG. 2 illustrates a memory block having a four-layer structure including cell arrays MA0 to MA3, the invention is not limited to the memory block of FIG. 2.

The first-layer cell array MA0 includes a word line WL02, a memory cell MC0 formed on the word line WL02, and a bit line BL01$a$ formed on the memory cell MC0. The second-layer cell array MA1 includes a bit line B01$b$, a memory cell MC1 formed on the bit line B01$b$, and a word line WL12 formed on the memory cell MC1. An inter-layer insulator IL0 is formed between the bit line BL01$a$ of the cell array MA0 and the bit line BL01$b$ of the cell array MA1 to insulate the bit lines BL01$a$ and the BL01$b$ from each other.

The third-layer cell array MA2 includes a word line WL12, a memory cell MC2 formed on the word line WL12, and a bit line BL11$a$ formed on the memory cell MC2. The fourth-layer cell array MA3 includes a bit line B11$b$, a memory cell MC3 formed on the bit line B11$b$, and a word line WL22 formed on the memory cell MC3. An inter-layer insulator IL1 is formed between the bit line BL11$a$ of the cell array MA2 and the bit line BL11$b$ of the cell array MA3 to insulate the bit lines BL11$a$ and BL11$b$ from each other.

In the embodiment, although the word line WL12 is shared by the cell arrays MA1 and MA2, the bit line BL is not shared by any memory cells. Alternatively, a structure of interconnection/cell/interconnection/cell may be formed such that the bit line BL is shared by the memory cells MC located above and below the bit line BL while the word line WL is shared by the memory cells MC located above and below the word line WL.

The memory block 1 can also be divided into MATs including some groups of memory cells. The column control circuit 2 and the row control circuit 3 may be provided in each MAT, each sector, or each cell array MA, or may be shared by MATs, sectors, or cell arrays MA. The column control circuit 2 and the row control circuit 3 may be shared by plural bit lines BL in order to reduce an area.

Desirably the first and second interconnections are made of a material having high heat-resistant property and low resistance value. For example, W, WSi, NiSi, and CoSi can be used as the first and second interconnections.

Figure 4:
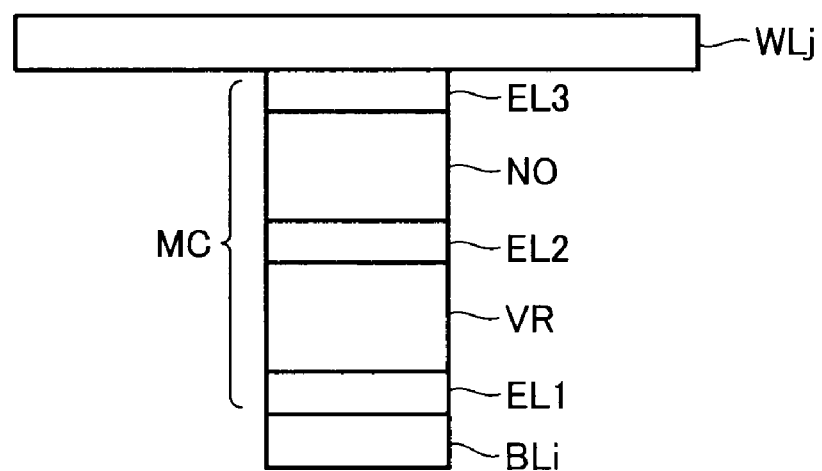
FIG. 4 is a sectional view showing one memory cell.

As shown in FIG. 4, the memory cell MC includes a circuit in which a variable resistive element VR and a non-ohmic element NO are connected in series.

The variable resistive element VR can change a resistance value through current, thermal, or chemical energy by application of a voltage. Electrodes EL1 and EL2 which act as barrier metals and adhesive layers are disposed above and below the variable resistive element VR. Examples of the electrode material include Pt, Au, Ag, TiAlN, SrRuO, Ru, RuN, Ir, Co, Ti, TiN, TaN, LaNiO, Al, PtIrOx, PtRhOx, and Rh/TaAlN. A metal film capable of achieving uniform orientation may also be interposed. Additionally, a buffer layer, a barrier metal layer, and an adhesive layer can be inserted.

The variable resistor VR may include one such as chalcogenide that varies the resistance through the phase change between the crystal state and the non-crystal state (PRAM); and one that comprises a composite compound containing cations of a transition element and varies the resistance through migration of cations.

Figure 5:
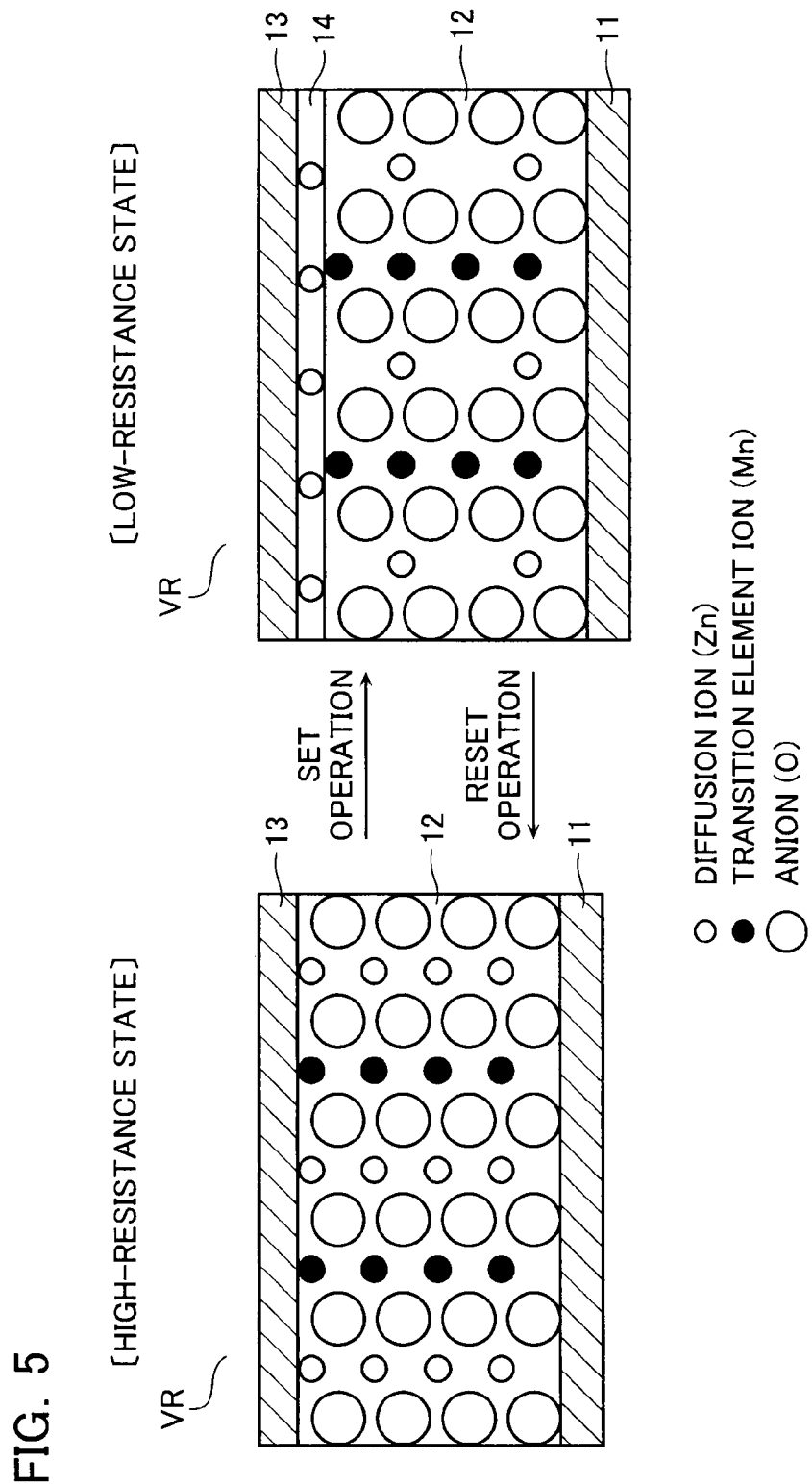
FIG. 5 is a sectional view schematically showing an example of a variable resistive element in the same embodiment.
Figure 6:
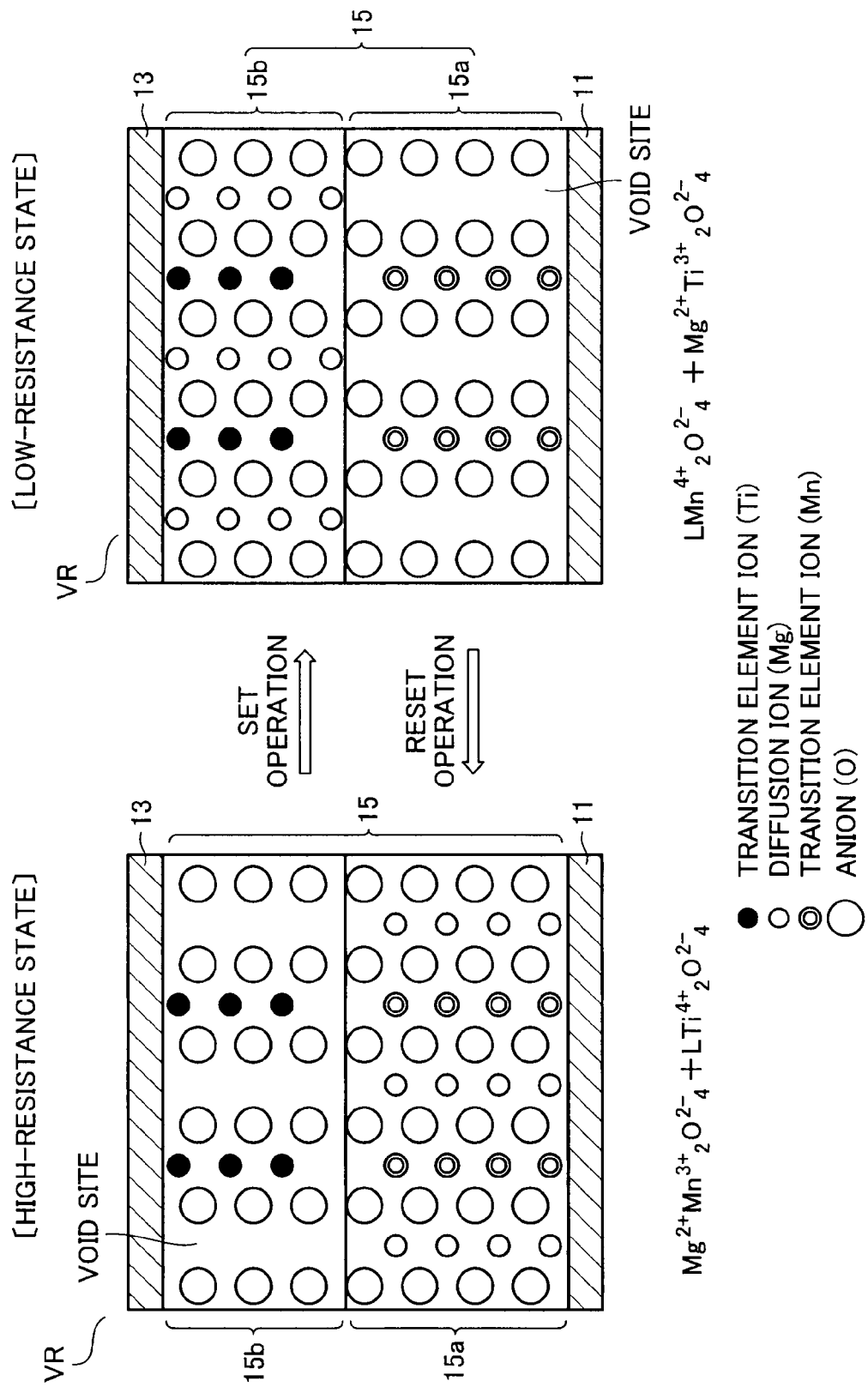
FIG. 6 is a sectional view schematically showing another example of the variable resistive element in the same embodiment.

FIGS. 5 and 6 show examples of the latter variable resistive element. In the variable resistive element VR of FIG. 5, a recording layer 12 is disposed between electrode layers 11 and 13. The recording layer 12 is made of a complex compound containing at least two kinds of cation elements. At least one of the kinds of cation elements is a transition element having the d orbital which is incompletely filled with electrons, and it is assumed that the shortest distance between adjacent cation elements is not more than 0.32 nm. Specifically, the complex compound is expressed by a chemical formula $A_xM_yX_z$ (A and M are elements different from each other). For example, the chemical formula $A_xM_yX_z$ is formed by a material having a crystal structure such as a spinel structure ($AM_2O_4$), ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($A_xMO_2$), a ramsdellite structure ($A_xMO_2$), or a perovskite structure ($AMO_3$).

In the example of FIG. 5, the letter A designates Zn, the letter M designates Mn, and the letter X designates O. A small white circle in the recording layer 12 indicates a diffusion ion (Zn), a large white circle indicates an anion (O), and a small black circle indicates a transition element ion (Mn). The recording layer is in a high-resistance state at an initial state. When a negative voltage is applied onto the side of the electrode layer 13 while the electrode layer 11 is set at a fixed potential, some of the diffusion ions in the recording layer 12 are moved onto the side of the electrode layer 13, and the amount of diffusion ion in the recording layer 12 is relatively decreased with respect to the amount of anion. The diffusion ion moved onto the side of the electrode layer 13 receives an electron from the electrode layer 13, and the diffusion ion is deposited as a metal, thereby forming a metal layer 14. The amount of anion becomes excessive in the recording layer 12, and a valence of the transition element ion is increased in the recording layer 12. Therefore, the recording layer 12 possesses electron conductivity by injection of a carrier, and set operation is completed. For reading, a current may be allowed to flow, of which value is very small so that the material configuring the recording layer 12 causes no resistance variation. In order to reset a program state (low-resistance state) to the initial state (high-resistance state), a large current is passed through the recording layer 12 for a sufficient time to generate Joule heating, thereby promoting an oxidation-reduction reaction of the recording layer 12. The reset operation can also be performed by applying an electric field opposite to that of the setting operation.

In the example of FIG. 6, a recording layer 15 sandwiched between the electrode layers 11 and 13 includes a first compound layer 15a and a second compound layer 15b. The first compound layer 15a is disposed on the side of the electrode layer 11, and is expressed by a chemical formula $A_xM1_yX1_z$. The second compound layer 15b is disposed on the side of the electrode layer 13, and has a cavity site in which the cation element of the first compound layer 15a can be accommodated.

In the example of FIG. 6, the letter A in the first compound layer 15a designates Mg, the letter M1 designates Mn, and the letter X1 designates O. Ti indicated by the black circle is contained as the transition element ion in the second compound layer 15b. A small white circle in the first compound layer 15a indicates the diffusion ion (Mg), a large white circle indicates the anion (O), and a double circle indicates the transition element ion (Mn). The first compound layer 15a and the second compound layer 15b may be stacked so as to become a multi-layer structure having at least two layers.

In the variable resistive element VR, potentials are given to the electrode layers 11 and 13 such that the first compound layer 15a becomes an anode while the second compound layer 15b becomes a cathode, and a potential gradient is generated in the recording layer 15, whereby some of the diffusion ions in the first compound layer 15a are moved in the crystal to invade into the second compound layer 15b on the cathode side. Because the cavity site which can accommodate the diffusion ion exists in the crystal of the second compound layer 15b, the diffusion ions moved from the side of the first compound layer 15a are trapped in the cavity site. Therefore, the valence of the transition element ion in the first compound layer 15a is increased while the valence of the transition element ion in the second compound layer 15b is decreased. In the initial state, assuming that the first and second compound layers 15a and 15b are in the high-resistance state, some of the diffusion ions in the first compound layer 15a are moved into the second compound layer 15b, whereby conduction carriers are generated in the first and second compound crystals. Therefore, both the first and second compound layers 15a and 15b have the electric conductivity. In order to reset the program state (low-resistance state) to the erase state (high-resistance state), similarly a large current is passed through the recording layer 15 for a sufficient time to generate the Joule heating, thereby promoting the oxidation-reduction reaction of the recording layer 15. The reset operation can also be performed by applying an electric field opposite to that of the setting operation.

As shown in FIG. 7, for example, the non-ohmic element NO is formed by various diodes such as (a) Schottky diode, (b) PN junction diode, and (c) PIN diode, (d) MIM (Metal Insulator Metal) structure, or (e) SIS structure (Silicon Insulator Silicon). The electrodes EL2 and EL3 constituting the barrier metal layer and the adhesive layer may be inserted. In the case of using the diode, a uni-polar operation can be performed because of the characteristic of the diode. A bipolar operation can be performed in the case of the MIM structure and the SIS structure. The arrangement of the non-ohmic element NO and the variable resistive element VR may be vertically reversed in FIG. 4, or polarities of the non-ohmic element NO may be inverted. However, in such cases, the bit line BL is shared by the adjacent memory cell arrays, and the word line WL is individually provided.

Figure 8:
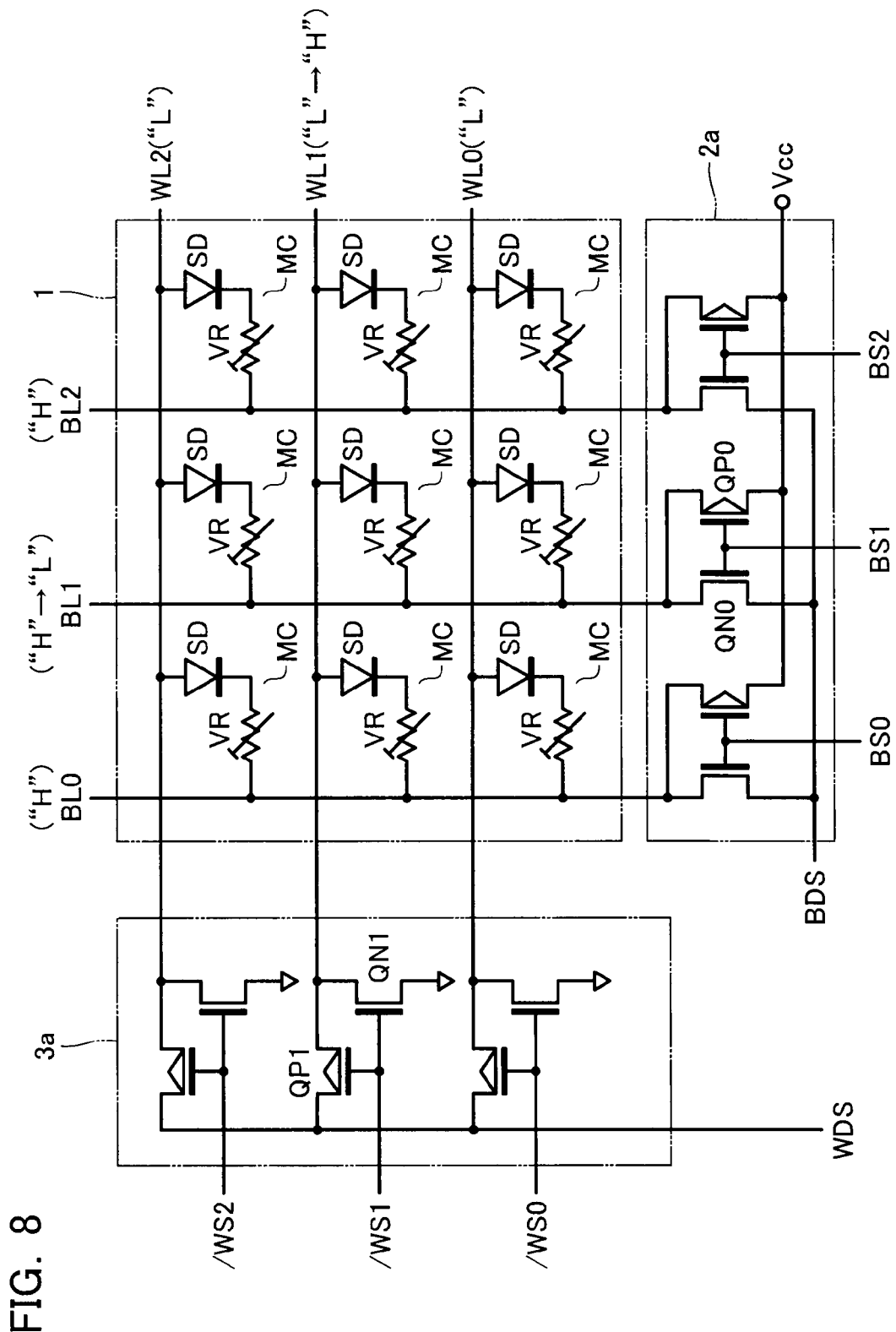
FIG. 8 is a circuit diagram showing a memory cell array and a peripheral circuit thereof in the nonvolatile memory of the same embodiment.

FIG. 8 is a circuit diagram showing one layer of the memory block 1 and the peripheral circuit thereof in the case where a diode SD is used as the non-ohmic element NO.

In FIG. 8, an anode of the diode constituting the memory cell MC is connected to the word line WL, and a cathode is connected to the bit line BL through the variable resistive element VR. One end of each bit line BL is connected to a selection circuit 2a which is a part of the column control circuit 2. One end of each word line WL is connected to a selection circuit 3a which is a part of the row control circuit 3.

The selection circuit 2a includes a selection PMOS transistor QP0 and a selection NMOS transistor QN0. The selection PMOS transistor QP0 and the selection NMOS transistor QN0 are provided in each bit line BL, and gates and drains are commonly connected. A source of the selection PMOS transistor QP0 is connected to a high-potential power supply Vcc. A source of the selection NMOS transistor QN0 is connected to a bit line-side drive sense line BDS. The write pulse is applied to the bit line-side drive sense line BDS, and a current to be detected is passed through the bit line-side drive sense line BDS during the data read. The common drain of the transistors QP0 and QN0 is connected to the bit line BL, and a bit line selection signal BSi for selecting each bit line BL is supplied to the common gate.

The selection circuit 3a includes a selection PMOS transistor QP1 and a selection NMOS transistor QN1. The selection PMOS transistor QP1 and the selection NMOS transistor QN1 are provided in each word line WL, and gates and drains are commonly connected. A source of the selection PMOS transistor QP1 is connected to a word line-side drive sense line WDS. The write pulse is applied to the word line-side drive sense line WDS, and the current to be detected is passed through the word line-side drive sense line WDS during the data read. A source of the selection NMOS transistor QN1 is connected to a low-potential power supply Vss. The common drain of the transistors QP1 and QN1 is connected to the word line WL, and a word line selection signal /WSi for selecting each word line WL is supplied to the common gate.

The example shown above is suitable for selecting the memory cells individually. In contrast, in batch read of data from plural memory cells MC connected to the word line WL1, sense amplifiers are arranged individually for the bit lines BL0 to BL2, and the bit lines BL0 to BL2 are connected to the sense amplifiers individually via the selection circuit 2a by the bit line selection signal BS.

Binary Data Read and Write Operation

A binary data read and write operation will be described below.

Figure 9:
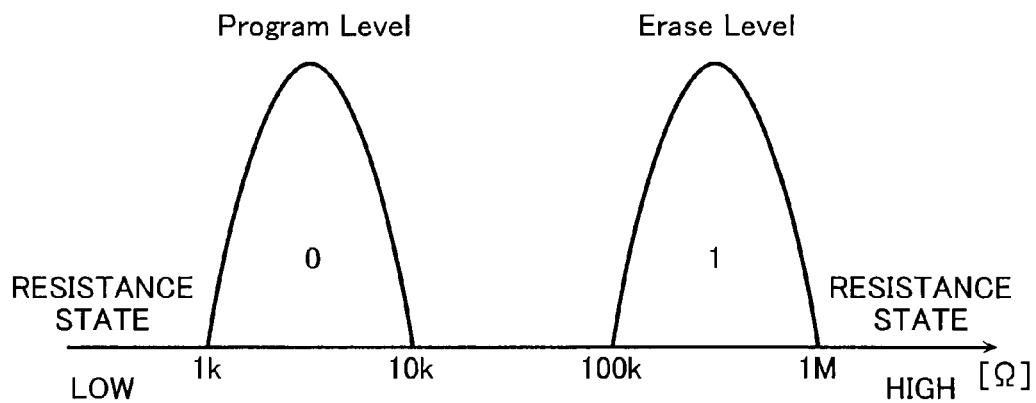
FIG. 9 is a graph showing a relationship between data and a resistance value distribution of a memory cell in the case of binary data.

In the circuit described above, the data is stored in the form of magnitude of the resistance value of the variable resistance element VR in each memory cell MC. In a non-selection state, for example, the word line selection signals /WS0, /WS1, . . . are set at an "H" level and the bit line selection signals BS0, BS1, . . . are set at an "L" level. In this case, all the word lines WL are set at the "L" level, and all the bit lines BL are set at the "H" level. In the non-selection state, the diodes SD of all the memory cells MC which are in a reverse bias state are turned off, and the current is not passed through the variable resistive element VR. Supposing that the central memory cell MC connected to the word line WL1 and the bit line BL1 is selected, the row control circuit 3 sets the word line selection signal /WS1 at the "L" level, and the column control circuit 2 sets the bit line selection signal BS1 at the "H" level. Therefore, the word line WL1 is connected to the word line-side drive sense line WDS, and the bit line BL1 is connected to the bit line-side drive sense line BDS. When the "H" level is applied to the drive sense line WDS while the "L" level is applied to the drive sense line BDS, the word line WL1 becomes the "H" level, and the bit line BL1 becomes the "L" level. Therefore, in the selected cell, the diode SD becomes a forward bias to pass the current. At this point, an amount of current passed through the selected cell depends on the resistance value of the variable resistance element VR, so that the data can be read by detecting the magnitude of the current amount. That is, as shown in FIG. 9, assuming that "1" corresponds to the high-resistance erase state while "0" corresponds to the low-resistance program state, "1" can be detected when the sensed current value is small, and "0" can be detected when the sensed current value is large.

Because the selected word line WL1 and the non-selected bit line BL are set at the "H" level, the current is not passed between the selected word line WL1 and the non-selected bit line BL. Because the non-selected word line WL and the selected bit line BL1 are set at the "L" level, the current is not passed between the non-selected word line WL and the selected bit line BL1. Accordingly, the current is not passed through the memory cells except for the selected memory cell.

Figure 10:
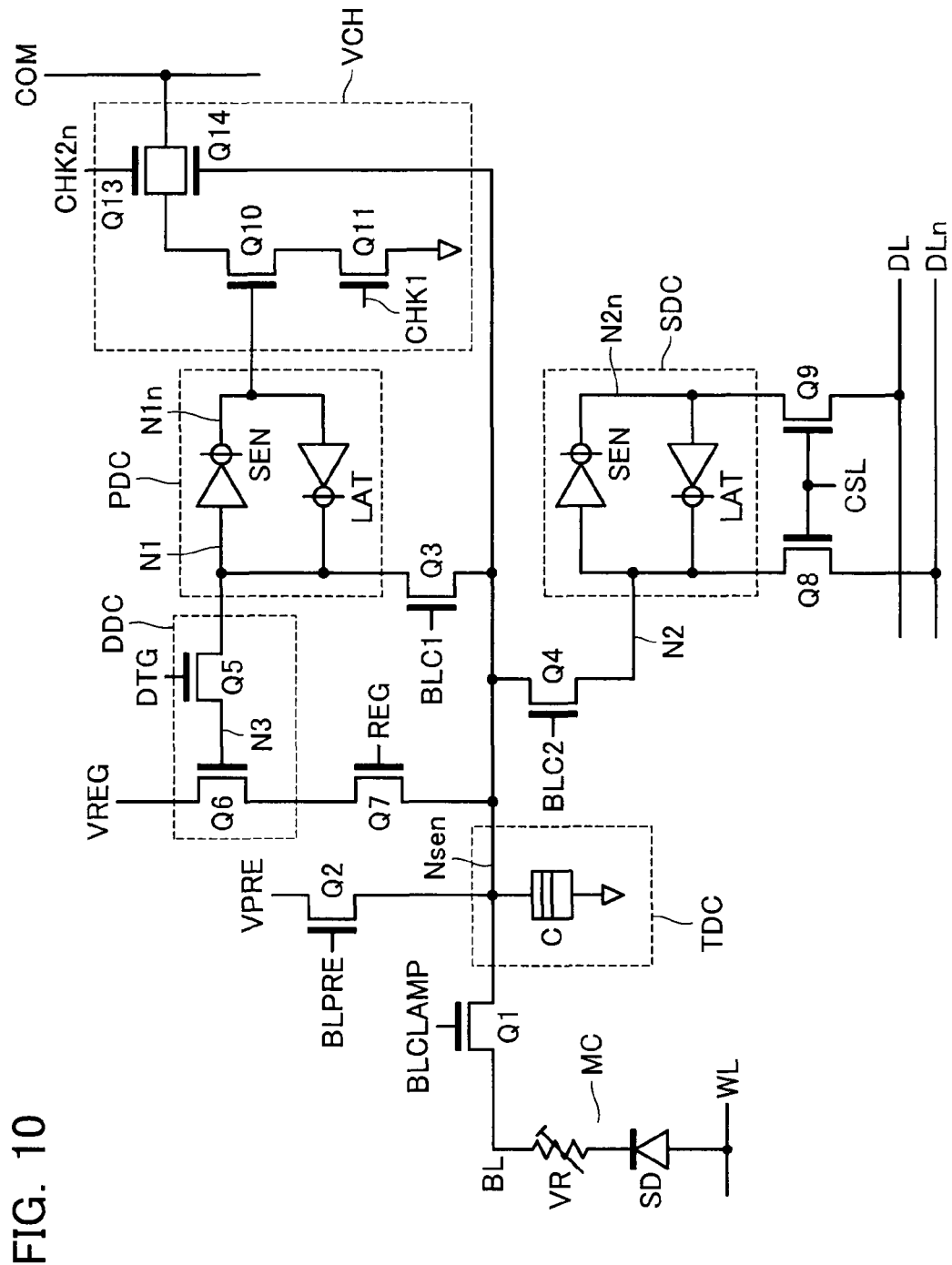
FIG. 10 is a circuit diagram showing a configuration of a sense amplifier in the same embodiment.

FIG. 10 shows a basic configuration of a binary-data sense amplifier circuit applicable to the above-described cell array. The sense amplifier circuit is provided in the column control circuit 2. However, in the case where the sense operation is performed on the side of the word line WL, the sense amplifier circuit is provided in the row control circuit 3.

The sense amplifier circuit is a single-end type voltage detection sense amplifier, and a sense node Nsen is connected to the bit line BL through a clamp NMOS transistor Q1. The clamp NMOS transistor Q1 clamps a bit line voltage and serves as a pre-sense amplifier. A pre-charge NMOS transistor Q2 which pre-charges the bit line BL is also connected to the sense node Nsen.

A charge retaining capacitor C is connected to the sense node Nsen, and the charge retaining capacitor C and the sense node Nsen constitute a data storage circuit TDC in which sense data is temporarily retained.

The sense node Nsen is connected to a data latch PDC which is a main data storage circuit through a transfer NMOS transistor Q3. The sense node Nsen is also connected to a data latch SDC through a transfer NMOS transistor Q4, and the data latch SDC constitutes a data storage circuit which is used to send and receive the data to and from the outside. Accordingly, the data latch SDC is connected to data lines DL and DLn through column selection gates Q8 and Q9 which are driven by a column selection signal CSL.

A dynamic data storage circuit DDC is provided between a data node N1 of the data latch PDC and the sense node Nsen. The dynamic data storage circuit DDC temporarily retains the write data and writes the write data in the next cycle. A transfer NMOS transistor Q5 is provided between a gate N3 of an NMOS transistor Q6 as storage node and the data node N1 of the data latch PDC. An NMOS transistor Q7 is disposed to write the desired data in the sense node Nsen according to the data at the storage node N3.

A verify check circuit VCH is provided in order to monitor a data node N1n of the data latch PDC to perform verify determination. The verify check circuit VCH includes a detecting NMOS transistor Q10 whose gate is connected to the data node N1n, an NMOS transistor Q11 which is activated by selectively grounding a source thereof, and transfer gate NMOS transistors Q13 and Q14 which connect a drain of the NMOS transistor Q10 to a signal line COM.

The signal line COM is a common signal line which is commonly provided in sense amplifiers SA for one page, and a pre-charge circuit (not shown) is provided to previously set the signal line COM at the "H" level. The verify check circuit VCH detects whether or not the pre-charged signal line COM is discharged based on verify read data of the data latch PDC.

In write verify, the data latch PDC becomes "1" (N1="H") when the write is completed. Accordingly, all the data latches PDC become "1" when the write of one page is completed.

When a point where the write is insufficient exists, the verify check circuit VCH discharges the signal line COM based on N1n="H". The signal line COM is not discharged when the write is completed. Accordingly, a controller can monitor the signal line COM to control a write sequence.

The sense amplifier circuit of FIG. 10 is configured so as to be applied to both the binary data storage system and the four-level data storage system. In the binary data storage system, the data latch SDC is not required from the viewpoint of operation principle. In the four-level data storage system, however, the data latch SDC is required.

That is, in the four-level data storage system, it is necessary that lower page data already written in the memory cell array be read to refer to for the purpose of write verify of an upper page. Therefore, the write data is retained in the data latch PDC, the lower page data read from the cell array is retained in the data latch SDC, and the write verify is performed.

The sense operation in the sense amplifier circuit having the above-described configuration will be described below.

The word line WL and bit line BL connected to the memory cell MC from which the data is read are selected. While the clamp NMOS transistor Q1 is turned off, the word line WL is set at the "H" level and the bit line BL is set at the "L" level. Therefore, the current having the value corresponding to the resistance value of the memory cell MC is passed through the bit line BL, and the charges are accumulated in a parasitic capacitance of the bit line BL according to the current value. Specifically, the potential at the bit line BL becomes high when the memory cell MC has a low resistance, and the potential at the bit line BL becomes low when the memory cell MC has a high resistance. At the same time, or after this, the pre-charge transistor Q2 is turned on to pre-charge the charge retaining capacitor C. Then VBLC+Vt (Vt is a threshold voltage of the NMOS transistor Q1) is applied to the gate of the clamp transistor Q1. The transistor Q1 is kept at the turn-off state when the voltage at the bit line BL is not lower than VBLC. When the voltage at the bit line BL is lower than VBLC, the transistor Q1 is turned on, and the charges of the charge retaining capacitor C are discharged onto the side of the bit line BLC. Accordingly, the voltage at the sense node Nsen becomes "H" when the memory cell MC has the low resistance, and the voltage at the sense node Nsen becomes "L" when the memory cell MC has the high resistance. The voltage is used as the read data and latched in the data latch PDC through the transfer NMOS transistor Q3, and the read data can be read on the data lines DL and DLn at certain timing through the data latch SDC.

Figure 11:
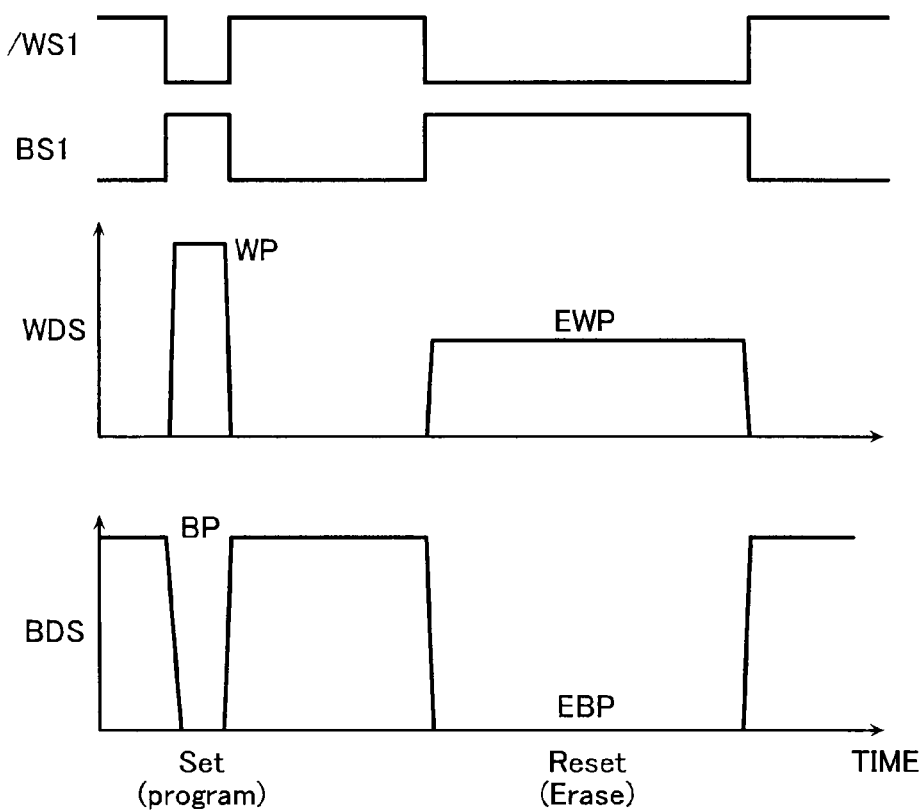
FIG. 11 is a waveform chart showing selection signals /WS and BS and write pulses WP and BP at the time of data write in the embodiment.

FIG. 11 is a waveform chart showing selection signals /WS and BS during data write and write pulses WP and BP applied to drive data lines WDS and BDS. The write pulses WP and BP are generated by and supplied from the pulse generator 9 including a boosting circuit.

In the data set in which the memory cell is changed from the high-resistance state to the low-resistance state, the word line selection signal /WS1 of the word line WL1 corresponding to the memory cell in which the data is written is set at the "L" level, and the bit line selection signal BS1 of the bit line BL1 corresponding to the memory cell in which the data is written is set at the "H" level. At the same time, the write pulse WP is given to the word line-side drive sense line WDS to change the resistance value of the variable resistive element VR from the erase level to the program level. It is assumed that a pulse height of the write pulse WP is set at the Vcc level. At the same time, the negative write pulse BP which becomes the Vss level is given to the bit line-side drive sense line BDS. Therefore, the variable resistive element VR in the high-resistance state (erase state) can be set at the low-resistance state (program state).

In the data reset in which the memory cell is changed from the low-resistance state to the high-resistance state, the batch erase of data can be performed to the plural memory cells, and the data can be erased separately in each memory cell. In such cases, the word line selection signal /WS1 of the word line WL1 corresponding to the memory cell from which the data is erased is set at the "L" level for a time longer than that of the data set, and the bit line selection signal BS1 of the bit line BL1 corresponding to the memory cell in which the data is written is set at the "H" level a time longer than that of the data set. In the data erase, because the memory cell is in the low-resistance state, an erase pulse EWP which is lower than that of the data set is applied to the word line-side drive sense line WDS, and the negative erase pulse EBP which becomes the Vss level is applied to the bit line-side drive sense line BDS. Therefore, the larger amount of current is passed through the variable resistive element VR which is in the low-resistance state for a long time, so that the variable resistive element VR can be reset to the high-resistance state by the Joule heat.

First Embodiment in which Word Line WL is Shared

A semiconductor memory device in which the word line WL is shared according to a first embodiment of the invention will be described in detail.

Figure 12:
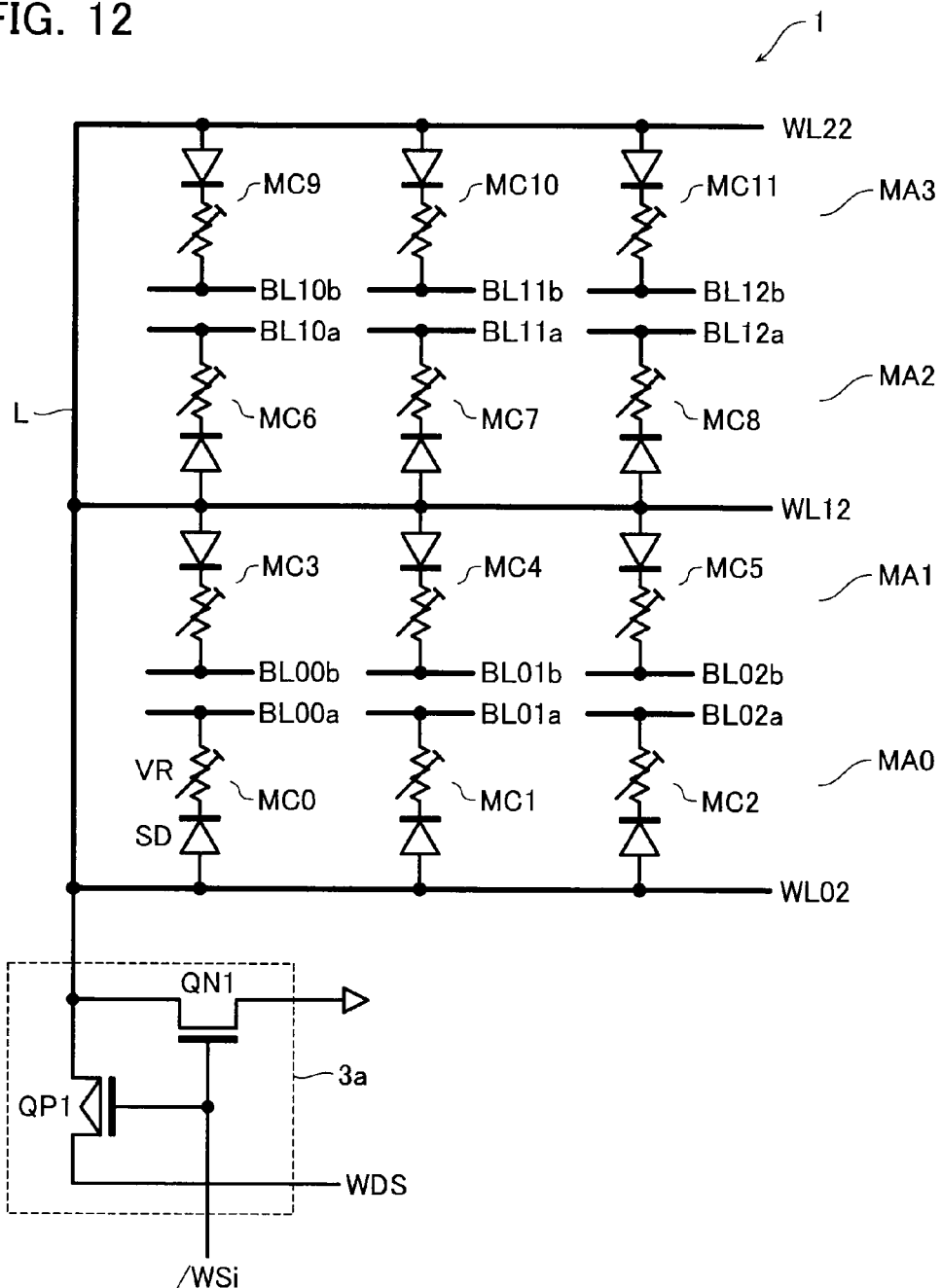
FIG. 12 is a schematic diagram showing a circuit structure of a memory block of a nonvolatile semiconductor memory according to a first embodiment of the invention.

FIG. 12 schematically shows a circuit structure of the memory block 1 of FIG. 2. In FIG. 12, the inter-layer insulator is omitted.

Figure 13:
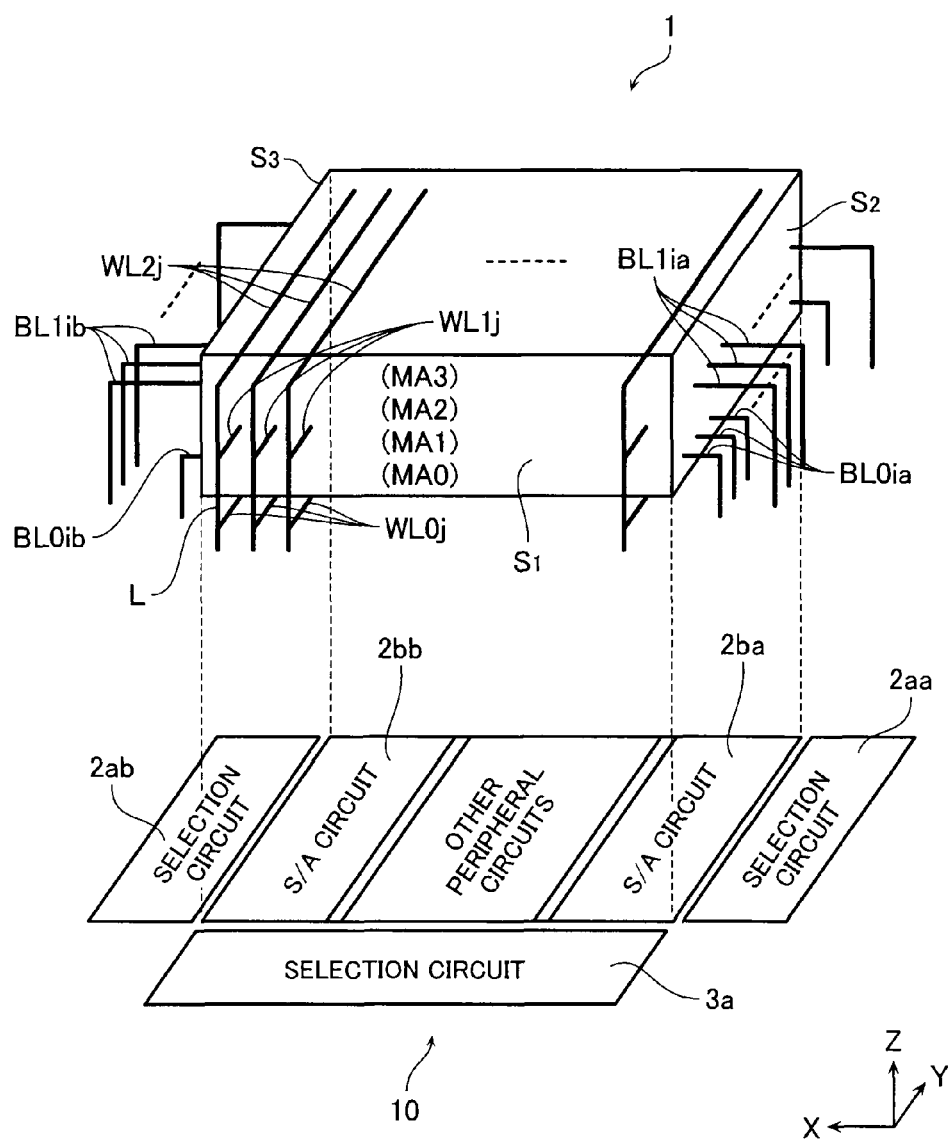
FIG. 13 is a perspective view showing the memory block of the nonvolatile semiconductor memory of the first embodiment of the invention.

FIG. 13 is a perspective view schematically showing the memory block. As shown in FIG. 12, as described above, the variable resistive element VR and the diode SD are connected in series in the memory cells MC0 to MC11. The anode of the diode SD is connected to the word line WL, and the cathode is connected to the bit line BL through the variable resistive element VR.

The first-layer cell array MA0 and the second-layer cell array MA1 are vertically symmetrically formed on either side of the inter-layer insulator between the bit lines BL. Similarly the third-layer cell array MA2 and the fourth-layer cell array MA3 are vertically symmetrically formed on either side of the inter-layer insulator between the bit lines BL.

The anodes of the diodes SD of the memory cells MC3 to MC5 in the cell array MA1 are connected to the lower side of the word line WL12, and the anodes of the diodes SD of the memory cells MC6 to MC8 in the cell array MA2 are connected to the upper side of the word line WL12. Therefore, the word line WL12 is shared by the second-layer cell array MA1 and the third-layer cell array MA2.

The ends of the word lines WL01, WL12, and WL22 are connected to one another by an interconnection L which is extended in the perpendicular direction. The interconnection L is extended perpendicularly downward, and connected to the source electrode of the PMOS transistor QP1 in the selection circuit 3a.

As shown in FIG. 13, the selection circuit 3a which selects the word line WL, the selection circuit 2a which selects the bit line BL, a sense amplifier circuit 2b, and a peripheral circuit 10 including other circuits are formed in a semiconductor substrate surface immediately below the memory block 1. The selection circuit 3a is provided in the semiconductor substrate surface along a side face S1 in an X direction of the memory block 1. The selection circuit 2a includes selection circuits 2aa and 2ab, which are provided in the semiconductor substrate surface along side faces S2 and S3 in a Y direction of the memory block 1. The sense amplifier circuit 2b includes sense amplifier circuits 2ba and 2bb, which are provided in the semiconductor substrate surface in relation to the selection circuits 2aa and 2ab. The interconnection Lj which connects word lines WL0j, WL1j, and WL2j is extended in a Z direction along the side face S1 and connected to the selection circuit 3a. In the bit lines BL, bit lines BL0ia and BL1ia are extended in the Z direction from the side face S2 of the memory block 1 and connected to the selection circuit 2aa. In the bit lines BL, bit lines BL0ib and BL1ib are extended in the Z direction from the side face S3 and connected to the selection circuit 2ab.

In the first embodiment, for example, in the case where the nonvolatile memory includes the memory block 1 having a four-layer structure, four layers of the bit lines BL are formed while three layers of the word lines WL are formed. Accordingly, the number of layers of the word line to be formed can be decreased by one compared with the number of layers of the bit line, which contributed to cost reduction.

The one selection circuit 3a can be shared by the word lines WL0j to WL2j which are vertically stacked in the memory block 1. Accordingly, the chip area can be reduced, and the contribution to the higher integration can be achieved.

Figure 14:
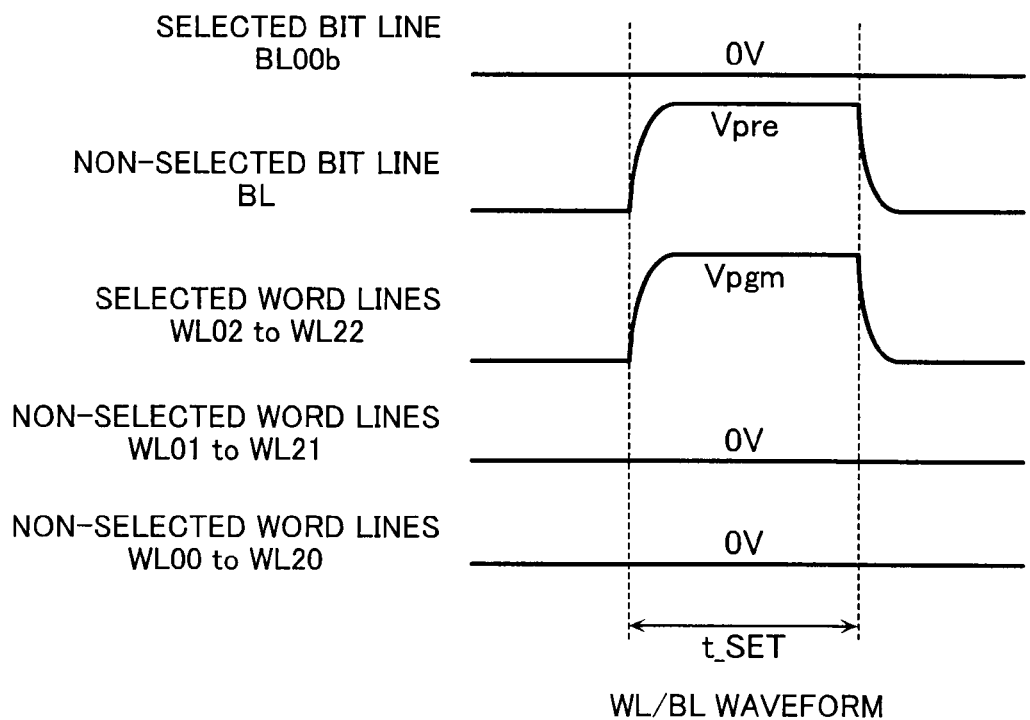
FIG. 14 is a timing chart of a write operation in the nonvolatile semiconductor memory of the first embodiment of the invention.

An operation of the nonvolatile semiconductor memory of the first embodiment will be described below. FIG. 14 is a timing chart of the write operation.

The case in which the data is written in the memory cell MC0 will be described by way of example. The set and reset operation principles of the variable resistive element VR have been already described above, so that the repetitive description is omitted.

The word line selection signal /WSi is supplied to the common gate of the selection circuit 3a to turn on the selection transistor QP1. Then a write voltage pulse Vpgm generated by the pulse generator 9 is simultaneously applied to the word lines WL02, WL12, and WL22 from the word line drive sense line WDS through the drain of the selection transistor QP1 and the interconnection L. At this point, the sense amplifier circuit applies 0 V to the bit line BL00a connected to the memory cell MC0. Therefore, because the set voltage Vpgm is applied in the forward direction to the memory cell MC0, the variable resistive element VR is changed from the high-resistance state to the low-resistance state.

At this point, the sense amplifier circuit applies a voltage Vpre to the non-selected bit lines BL except for the bit line BL00a in order to prevent wrong write of the non-selected cell. For example, the voltage Vpre is set at a voltage which is larger than the set voltage Vpgm. Therefore, the reverse bias is applied to the non-selected memory cells MC1 to MC11, and the data write is not performed to the memory cells MC1 to MC11. However, the voltage Vpre is not limited to the voltage which is larger than the set voltage Vpgm, but any voltage can be used as long as the wrong write is not generated in the non-selected cells MC1 to MC11.

The potential of 0 V generated by the pulse generator 9 is applied through the selection circuit 3a to the non-selected word lines WL01, WL11, and WL21 and the non-selected word lines WL00, WL10, and WL20. At this point, the bias is not applied to the memory cell MC0 connected to the selection bit line BL00b, and the voltage Vpre which is the reverse bias voltage is applied to the memory cells MC1 to MC11 connected to the non-selected bit lines BL except for the bit line BL00a, thereby preventing the wrong write.

An example of the batch write of data in the memory block 1 of the first embodiment will be described below. The write data is serially fed from the external host (not shown) through the external I/O. The write data is transferred to and latched in all the sense amplifier circuits. The sense amplifier circuit applies 0 V to the selected bit line BL, and applies the voltage Vpgm to the non-selected bit lines BL at one time.

During the write operation, the potentials at the selected word lines WL02, WL12, and WL22 are kept at the voltage Vpgm, and the potential at the non-selected word lines WL are kept at 0 V.

Therefore, the different pieces of data can collectively be written in each bit line BL for the four-layer cell arrays MA stacked in the vertical direction, so that a write speed can be enhanced in the whole of the cell array.

In the nonvolatile semiconductor memory of the first embodiment, the number of layers of the word line is decreased by one layer compared with the number of layers of the bit line, so that the production cost can be reduced. Because the selection circuit is shared by the memory cells MC having the same address in the longitudinal direction, the area of the peripheral circuit can be reduced, and the contribution to the higher integration can be achieved.

Second Embodiment in which Word Line WL is Shared

A semiconductor memory device in which the word line WL is shared according to a second embodiment of the invention will be described in detail. The semiconductor memory device of the second embodiment differs from that of the first embodiment in that both ends of the word line WL are connected and one selection circuit is shared. In the second embodiment, the influence of the voltage drop caused by the word line WL can be avoided in addition to the effects of the cost reduction and high integration. In the following description, the same component as the first embodiment is designated by the same numeral.

Figure 15:
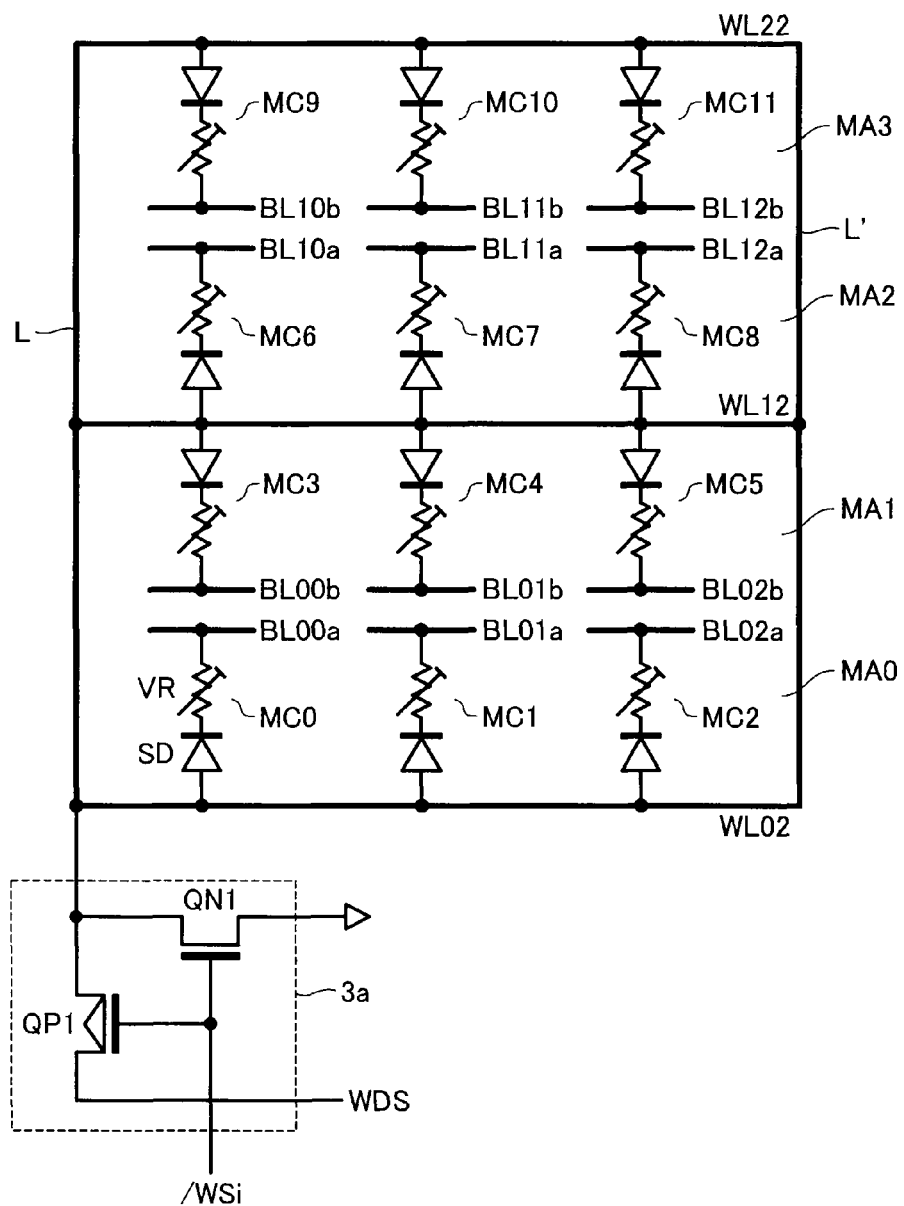
FIG. 15 is a schematic diagram showing a circuit structure of a memory block of a nonvolatile semiconductor memory according to a second embodiment of the invention.
Figure 16:
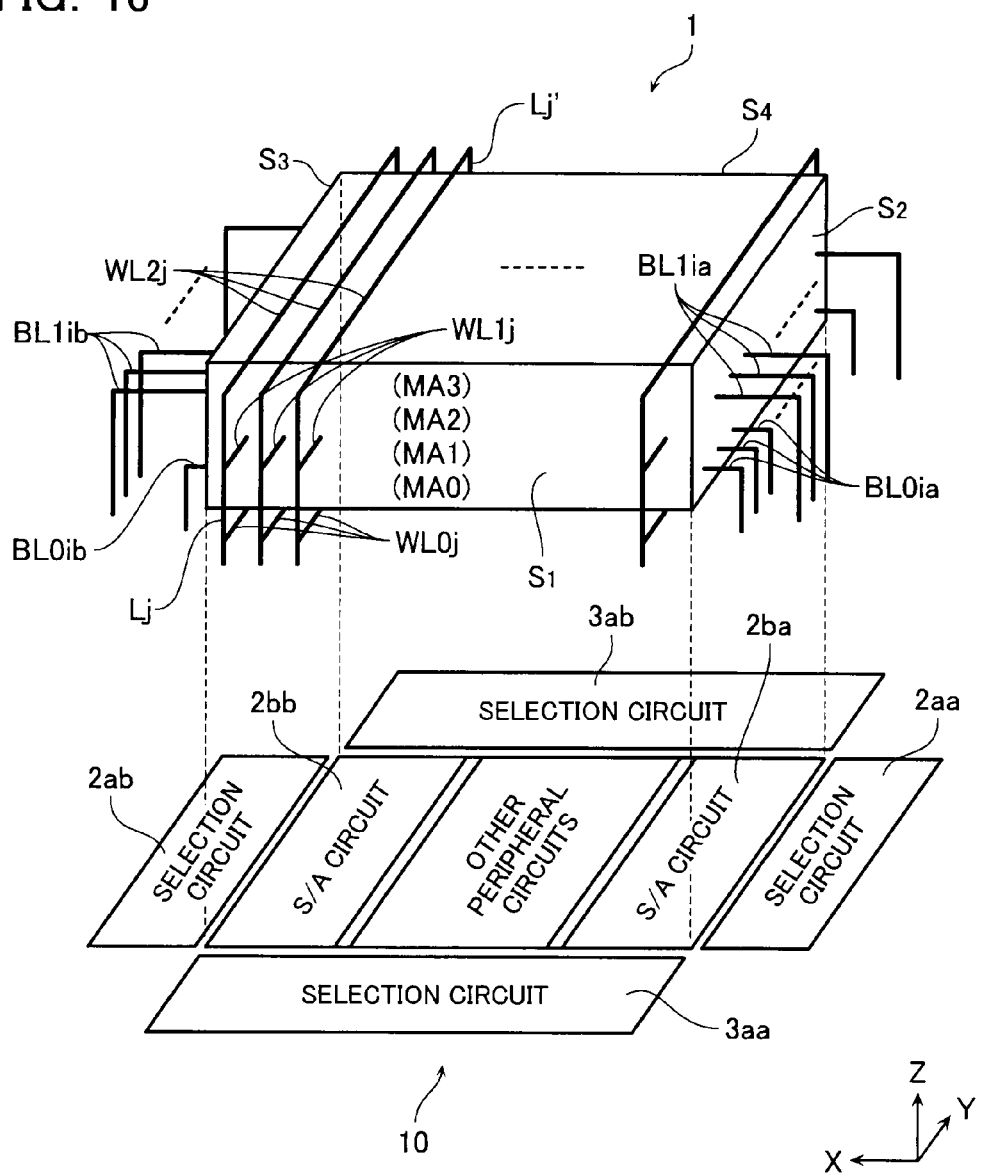
FIG. 16 is a perspective view showing the memory block of the nonvolatile semiconductor memory of the second embodiment of the invention.

FIG. 15 is a schematic diagram showing a circuit structure of a memory block of a nonvolatile semiconductor memory according to the second embodiment of the invention. In FIG. 15, the inter-layer insulator is omitted. FIG. 16 is a perspective view schematically showing the memory block. One of the ends of the word lines WL02, WL12, and WL22 are connected to each other by the interconnection L which is perpendicularly extended, and the other end of the word lines WL02, WL12, and WL22 are connected to each other by an interconnection L' which is perpendicularly extended in parallel with the interconnection L. The interconnection L is extended perpendicularly downward and connected to the source electrode of the PMOS transistor QP1 in the selection circuit 3a. In the second embodiment, the voltage drop is avoided in the end portion of the word line WL, and a delay of voltage transfer can be prevented.

As shown in FIG. 16, the selection circuit 3a which selects the word line WL, the selection circuit 2a which selects the bit line BL, a sense amplifier circuit 2b, and the peripheral circuit 10 including other circuits are formed in the semiconductor substrate surface immediately below the memory block 1. The selection circuit 3a includes selection circuits 3aa and 3ab, which are provided in the semiconductor substrate surface along side faces S1 and S4 in the X direction of the memory block 1. The selection circuit 2a includes the selection circuits 2aa and 2ab, which are provided in the semiconductor substrate surface along the side faces S2 and S3 in the Y direction of the memory block 1. The sense amplifier circuit 2b includes the sense amplifier circuits 2ba and 2bb, which are provided in the semiconductor substrate surface in relation to the selection circuit 2aa and 2ab. The interconnection Lj which connects one of the end portions of each of the word lines WL0j, WL1j, and WL2j is extended in the Z direction along the side face S1, and is connected to the selection circuit 3aa. The interconnection Lj' which connects the other end portion of each of the word lines WL0j, WL1j, and WL2j is extended in the Z direction along the side face S4, and is connected to the selection circuit 3ab. In the bit lines BL, bit lines BL0ia and BL1ia are extended in the Z direction from the side face S2 of the memory block 1 and connected to the selection circuit 2aa. In the bit lines BL, bit lines BL0ib and BL1ib are extended in the Z direction from the side face S3 and connected to the selection circuit 2ab.

As shown in FIG. 16, the selection circuits 3aa and 3ab are respectively disposed in the interconnection L and the interconnection L', thereby improving compensation effect of the voltage drop. The word line WL is connected to the lower-layer word line WL at the point where the word line WL is divided, and the delay can be equalized among the cell arrays. Therefore, the influence of the voltage drop caused by the word line WL can be minimized, and the correct write voltage can be applied to each memory cell MC. Accordingly, the improvement of the memory reliability can be achieved.

The write operation in the nonvolatile semiconductor memory of the second embodiment is similar to that of the first embodiment, so that the description is omitted.

In the nonvolatile semiconductor memory of the second embodiment, the number of layers of the word line is decreased by one layer compared with the number of layers of the bit line, so that the production cost can be reduced. Because the selection circuit is shared by the memory cells MC having the same address in the longitudinal direction, the area of the peripheral circuit can be reduced, and the contribution to the higher integration can be achieved. Because the same voltage is supplied to both the ends of the word line WL, the voltage drop can be compensated at the end portion of the word line WL, the delay of voltage transfer can be prevented, and the correct voltage can be applied to each memory cell. Accordingly, the improvement of the memory reliability can be achieved.

Third Embodiment in which Word Line WL is Shared

A semiconductor memory device in which the word line WL is shared according to a third embodiment of the invention will be described in detail. The semiconductor memory device of the third embodiment differs from that of the first embodiment in that the word lines WL are commonly connected every other layer. In the third embodiment, the lithography step can be reduced by reduction of the number of the bit line BL in addition to the effects of the cost reduction and high integration. In the following description, the same component as the first embodiment is designated by the same numeral.

Figure 17:
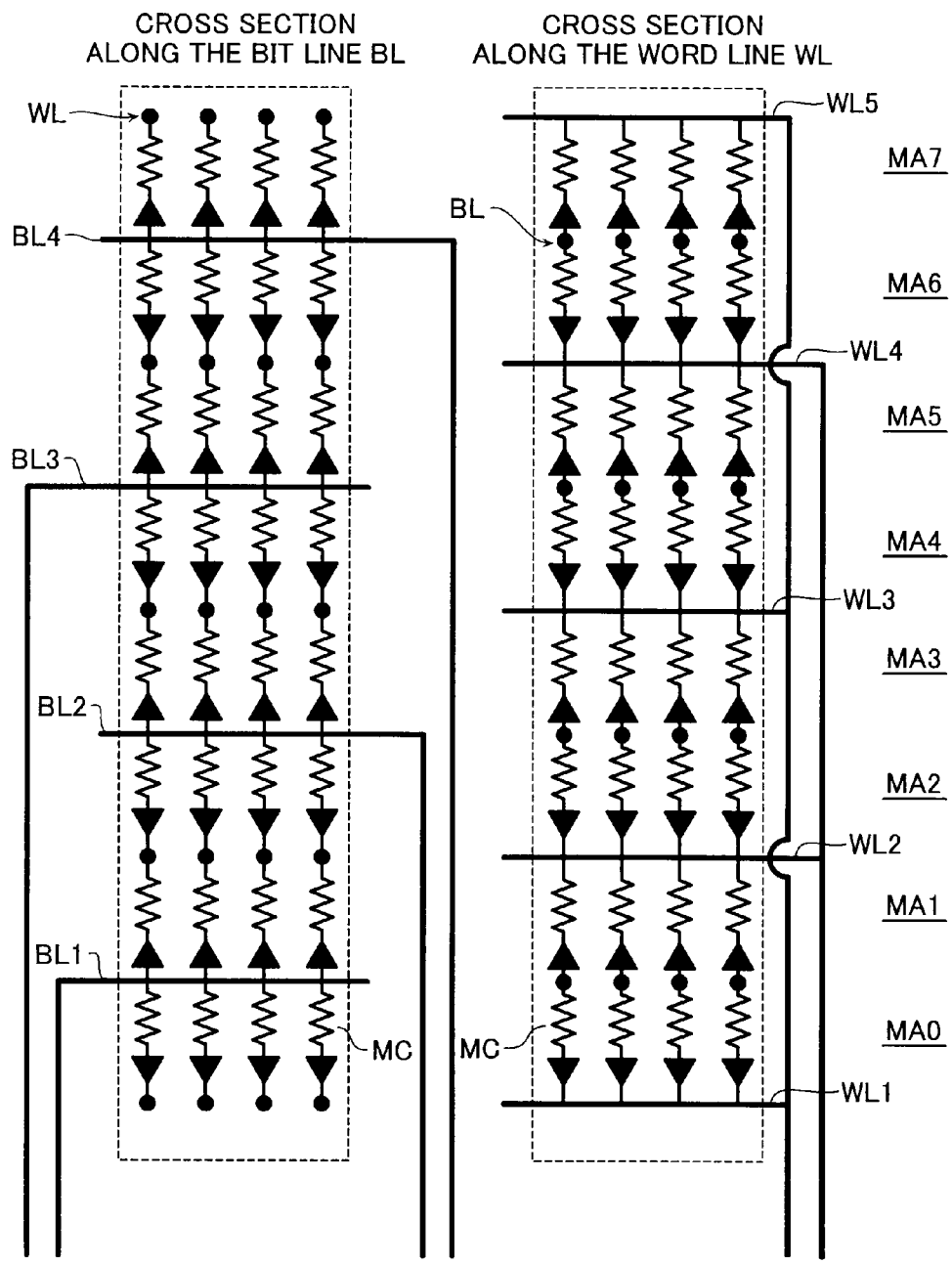
FIG. 17 is a schematic diagram showing a circuit structure of a memory block of a nonvolatile semiconductor memory according to a third embodiment of the invention.
Figure 18:
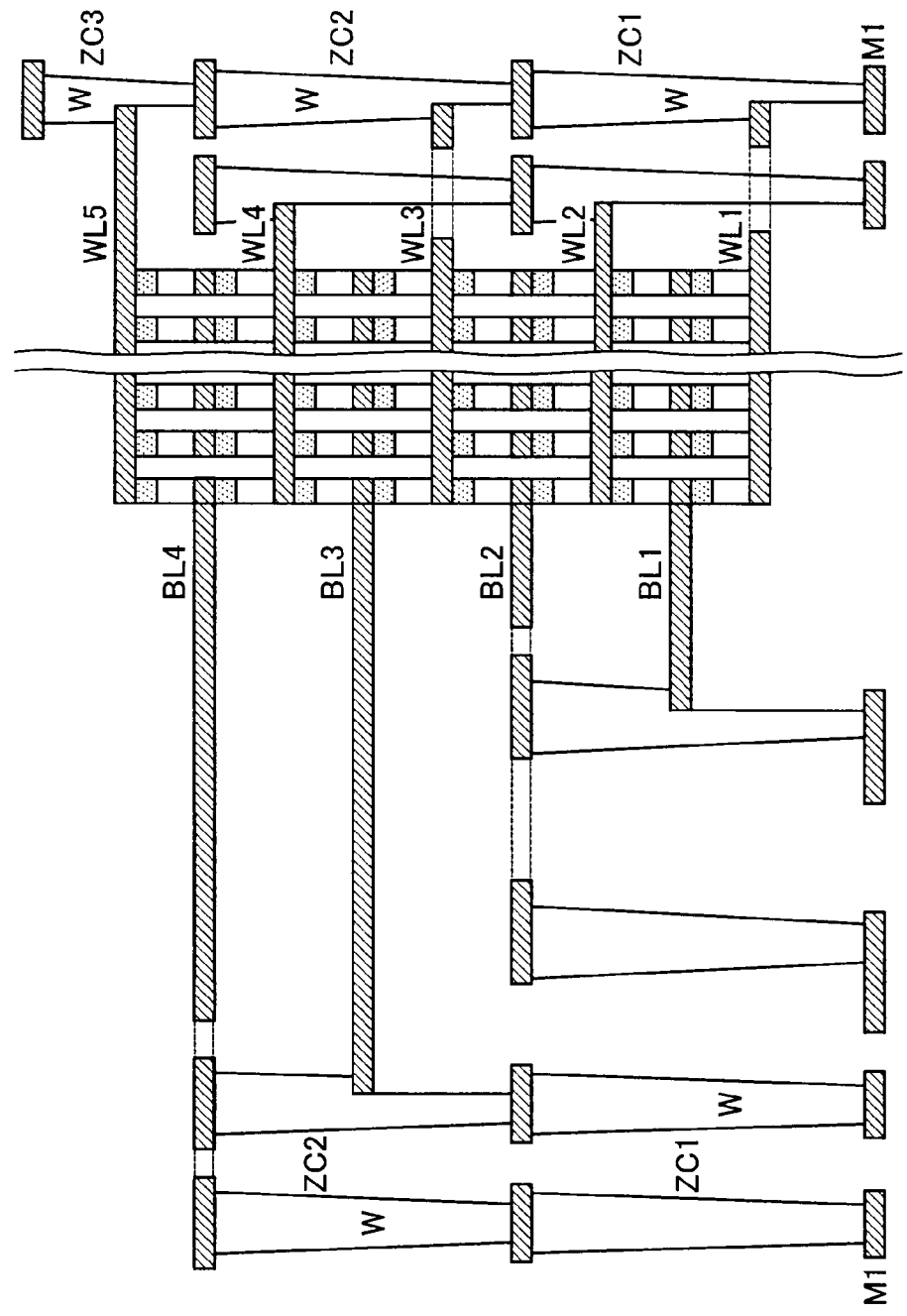
FIG. 18 is a sectional view of the memory block of the nonvolatile semiconductor memory according to the third embodiment of the invention.

FIG. 17 is a schematic diagram showing a circuit structure of a memory block of a nonvolatile semiconductor memory according to the third embodiment of the invention. FIG. 18 is a sectional view of the memory block. In FIGS. 17 and 18, the inter-layer insulator is omitted. In the memory block of the third embodiment, one ends of the word lines WL1, WL3, and WL5 are commonly connected each other through the contacts ZC1, ZC2 and ZC3, and one ends of the word lines WL2 and WL4 are commonly connected each other though the contacts ZC1 and ZC2. The contacts ZC1, ZC2 and ZC3 are extended perpendicularly downward and connected to the selection circuit via interconnection formed in a metal layer M1, respectively. In the third embodiment, the number of word lines WL which are commonly connected is approximately half of all of the word lines WL which are overlapped in vertical direction. As a result, a capacitance of the commonly connected word lines WL can be decreased. Thus, the delay of voltage transfer can be suppressed.

In the nonvolatile semiconductor memory of the third embodiment, the number of the layers in which the word lines WL and the bit lines BL are formed is only one larger than the number of the layers in which the memory cell is formed. Therefore, the production cost can be reduced.

Others

Thus, the embodiments of the invention have been described above. However, the invention is not limited to the embodiments, but various changes, modifications, additions, and applications can be made without departing from the scope of the invention. For example, the semiconductor memory device of the invention can be combined with a DRAM to form a computer system main memory. Therefore, the large-capacity main memory which is operated at high speed can be realized.

What is claimed is:

1. A semiconductor memory device comprising:
a memory block having a three-dimensional memory cell array structure in which memory cell arrays are stacked, each of the memory cell arrays including:
a plurality of first lines which are parallel to one another;
a plurality of second lines which are formed so as to intersect with the first lines, the second lines being parallel to one another;
a memory cell including a non-ohmic element and a variable resistor connected in series and disposed in each intersection portion of the first lines and the second lines, the non-ohmic element having a first conductivity type semiconductor and a second conductivity type semiconductor, the variable resister being connected to one of the first lines, the first conductivity type semiconductor of the non-ohmic element being connected to one of the second lines;
a first drive sense line connected to the first lines via first transistors, respectively; and
a second drive sense line connected to the second lines via second transistors, respectively, wherein
in a data write or data erase, the first drive sense line is driven to an "H" level and the second drive sense line is driven to an "L" level.

2. The semiconductor memory device according to claim 1, wherein the first lines included in each of the memory cell arrays are formed to overlap each other in a stacking direction of the memory cell arrays.

3. The semiconductor memory device according to claim 2, wherein first ends of the first lines overlapped in the stacking direction are commonly connected through a first vertically extended line.

4. The semiconductor memory device according to claim 1, further comprising a first control circuit and a second control circuit formed in a semiconductor substrate, the first control circuit selecting and driving the first drive sense line, and the second control circuit selecting and driving the second drive sense line.

5. The semiconductor memory device according to claim 1, wherein the number of the first lines in the memory block is smaller than that of the second lines.

6. The semiconductor memory device according to claim 1, wherein the second lines included in each of the memory cell arrays are formed to overlap each other in a stacking direction of the memory cell arrays.

7. The semiconductor memory device according to claim 6, wherein each end of the second lines overlapped in the stacking direction are not connected in common.

8. The semiconductor memory device according to claim 1, wherein one of the first lines is selected by inputting "L" level to a gate terminal of one of the first transistors.

9. The semiconductor memory device according to claim 8, wherein one of the second lines is selected by inputting "H" level to a gate terminal of one of the second transistors.

10. The semiconductor memory device according to claim 9, wherein the selected first line is applied "H" level and the selected second line is applied "L" level.

11. The semiconductor memory device according to claim 1, wherein the memory cell arrays are stacked so as to face the second lines of adjacent memory cell arrays.

12. The semiconductor memory device according to claim 11, wherein the memory cell arrays are stacked so as to share the first lines with an adjacent memory cell array.

* * * * *